(12) United States Patent
Thomas et al.

(10) Patent No.: US 7,102,908 B2
(45) Date of Patent: Sep. 5, 2006

(54) RELIABLE FERRO FUSE CELL

(75) Inventors: Roehr Thomas, Kanagawa-ken (JP); Hans-Oliver Joachim, Kanagawa-ken (JP); Nobert Rehm, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 76 days.

(21) Appl. No.: 10/651,753

(22) Filed: Aug. 29, 2003

(65) Prior Publication Data

US 2005/0047189 A1 Mar. 3, 2005

(51) Int. Cl.
*G11C 11/22* (2006.01)

(52) U.S. Cl. ................... 365/145; 365/225.7

(58) Field of Classification Search ........... 365/145, 365/149, 150, 225.7
See application file for complete search history.

(56) References Cited

U.S. PATENT DOCUMENTS

| | | | |
|---|---|---|---|
| 5,729,488 A | 3/1998 | Drab et al. ........... | 365/125 |
| 6,084,795 A * | 7/2000 | Nunokawa ........... | 365/145 |
| 6,141,237 A | 10/2000 | Eliason et al. ........... | 365/125 |
| 6,459,608 B1 * | 10/2002 | Tamura ........... | 365/145 |
| 6,834,006 B1 * | 12/2004 | Igarashi ........... | 365/145 |

FOREIGN PATENT DOCUMENTS

JP 9-45088 * 2/1997

OTHER PUBLICATIONS

U.S. Appl. No. 2003/156475, filed Aug. 21, 2003, Kang Hee Bok.
U.S. Appl. NO. 2003/0099125, filed May 2003, Kang Hee Bok.

* cited by examiner

*Primary Examiner*—Tan T. Nguyen
(74) *Attorney, Agent, or Firm*—Fish & Richardson P.C.

(57) ABSTRACT

The present invention includes a ferro fuse cell comprising a ferroelectric storage capacitor electrically connected to a plate on one side and to a sense amplifier on the other side. A ferroelectric measurement capacitor is electrically connected between the ferroelectric storage capacitor and the sense amplifier.

9 Claims, 10 Drawing Sheets read "0"

RELIABLE FERRO FUSE CELL

FIELD OF THE INVENTION

The present invention relates to the implementation of ferro fuse cells.

BACKGROUND OF THE INVENTION

Electrical fuses are used to store address information for redundancy repair of high-density memories or other set-up information in memory or logic circuit components. In contrast to conventional laser fuses, electrical fuses can be set and reset even in packaged components. Such electrical fuses can be implemented with non-volatile memory cells using ferroelectric capacitors. Read out of such a ferroelectric capacitor memory cell typically requires a certain optimized "measurement" capacitance. In memory circuits, the parasitic bit-line capacitance is used for this purpose. In ferro fuse circuits, typically only one single cell is connected to the sense amplifier, i.e. no bit line or only a very short bit-line exists. Therefore, the bit-line capacitance is replaced by a gate oxide capacitance.

FIG. 1 shows a ferro fuse circuit 101 of the prior art. A ferroelectric capacitor (C1) 103 is connected to a plate (PL) 105 on one side and to a measurement capacitor (C2) 107 on the other side. By pulsing the plate (PL) 105, a read signal develops on a node F 109 depending on the stored polarization state in the capacitor C1 103. If a "1" was stored in the ferroelectric capacitor C1 103 then a bigger voltage is obtained on the node F 109 (switching). If a "0" was stored then a smaller voltage is obtained on the node F 109 (non-switching). These two voltage levels are compared to a reference voltage VREF 111 by a differential sense amplifier (SA) 113 and the fuse data is available on a node FD 115. As the read operation is destructive, a write back is required, which is performed automatically by the sense amplifier 113.

FIG. 2 shows another prior art ferro fuse circuit 201. The circuit 201 uses two cells like the cell 101 in FIG. 1 are combined to store one single data bit. Two ferroelectric capacitors C1 203 and C3 204 are connected to a plate (PL) 205 on one side and to measurement capacitors C2 207 and C4 208 on the other. The two ferroelectric capacitors C1 203 and C3 204 always contain reversed data (i.e. if a "1" signal is obtained on a node F 209 then a "0" signal is obtained on a node /F 210, and visa versa). Thus the differential signal between the nodes F 209 and /F 210 is doubled compared to the implementation of FIG. 1. Fuse data output from a sense amplifier 213 is available on a node FD 215. Furthermore, no reference voltage is required. However, in the implementation of FIG. 2, the area for storage and measurement capacitors is doubled.

It would be desirable to produce a ferro fuse having a large signal margin.

SUMMARY OF THE INVENTION

The ferro fuse of the present invention provides both a large signal margin while reducing chip area and improving the reliability by using ferroelectric capacitors as "measurement" capacitors.

In a first example of the present invention, the "measurement" capacitance is implemented using a ferroelectric capacitor which is always in its non-switching state utilizing the high dielectric constant of the ferroelectric film. Alternatively, in a second example of the present invention, the "measurement" capacitance is implemented using a ferroelectric capacitor which is always in the reversed polarization state relative to the ferroelectric storage capacitor. In the first example, the area required for the "measurement" capacitance is reduced by one or two orders of magnitude depending on the chosen ferroelectric material. In the second example, the read signal is significantly increased and the reliability of the fuse circuit is enhanced.

In general terms, the present invention includes a ferro fuse cell comprising a ferroelectric storage capacitor electrically connected to a plate on one side and to a sense amplifier on the other side. A ferroelectric measurement capacitor is electrically connected between the ferroelectric storage capacitor and the sense amplifier.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
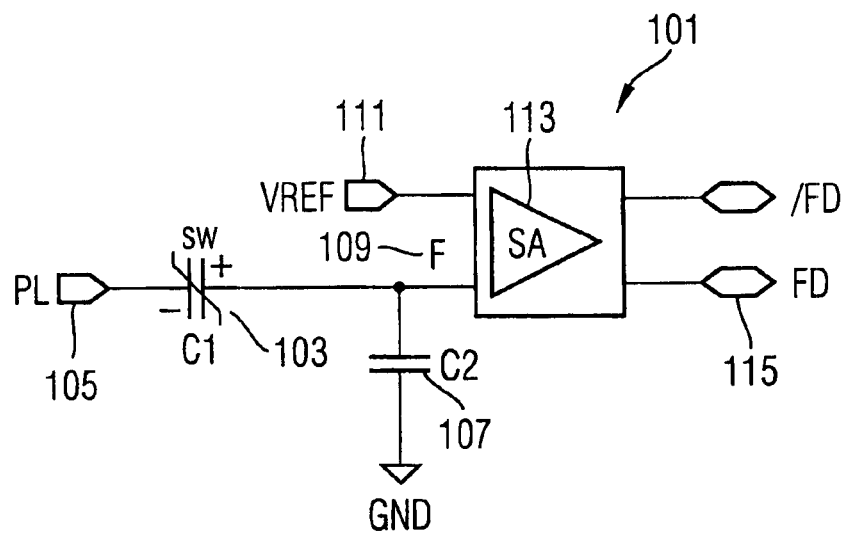
FIG. 1 shows a ferro fuse circuit of the prior art.
Figure 2:
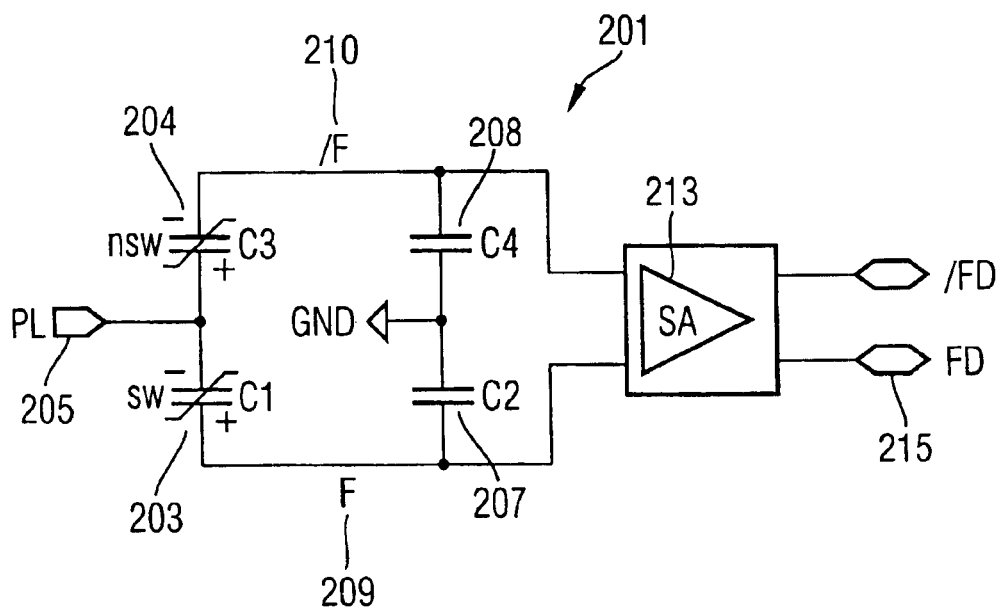
FIG. 2 shows a prior art ferro fuse circuit having two storage and two measurement capacitors.
Figure 3A:
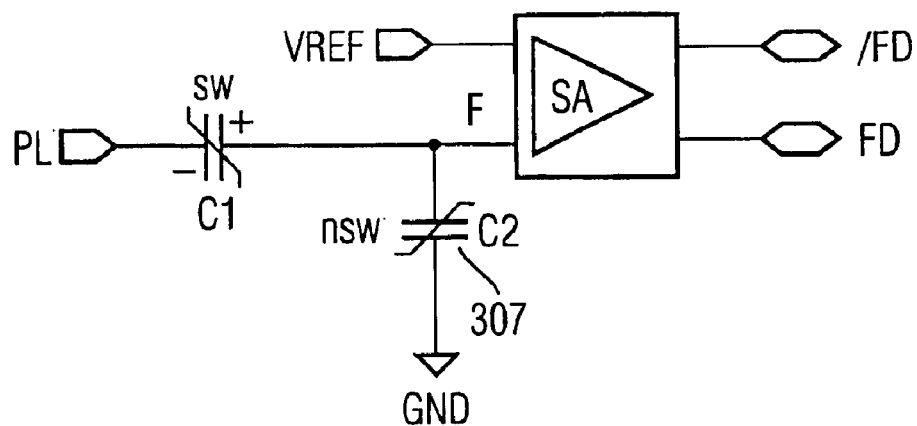
FIGS. 3a and 3b shows the inventive use of ferroelectric capacitors as the measurement capacitors.
Figure 3B:
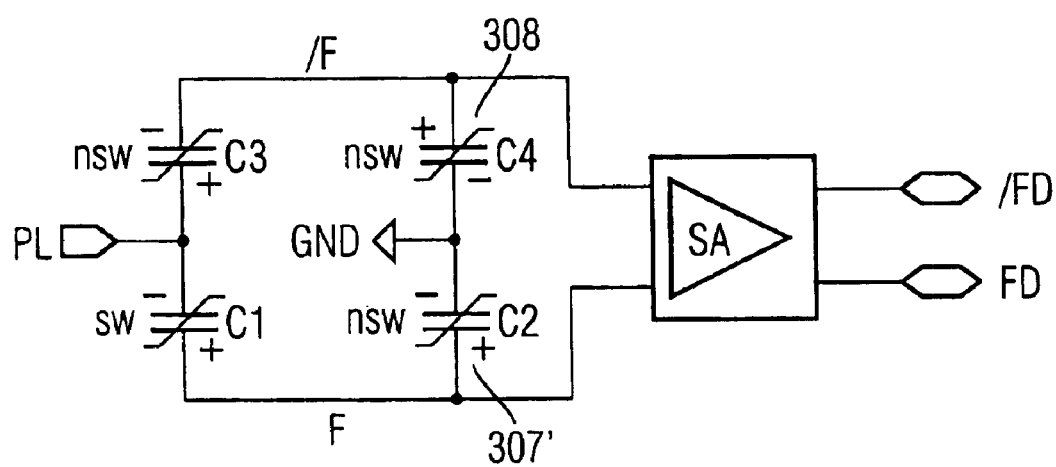

FIGS. 3a and 3b show embodiments of the present invention. The measurement capacitors C2 107, 207 and C4 208 of FIGS. 1 and 2 are replaced by ferroelectric capacitors C2 307, C2 307' and C4 308 (see FIGS. 3a and 3b) similar to the ferroelectric capacitors C1 103, C1 203 and C3 204 of FIGS. 1 and 2. The measurement capacitors C2 307, C2 307' and C4 308 of FIG. 3 are always maintained in their non-switching state. Due to the much higher dielectric constant of the ferroelectric material compared to a typical gate oxide, the area required for the measurement capacitors C2 307, C2 307' and C4 308 can be reduced by one or two orders of magnitude. The read and write back operation is similar to the implementations of FIGS. 1 and 2.

Figure 4:
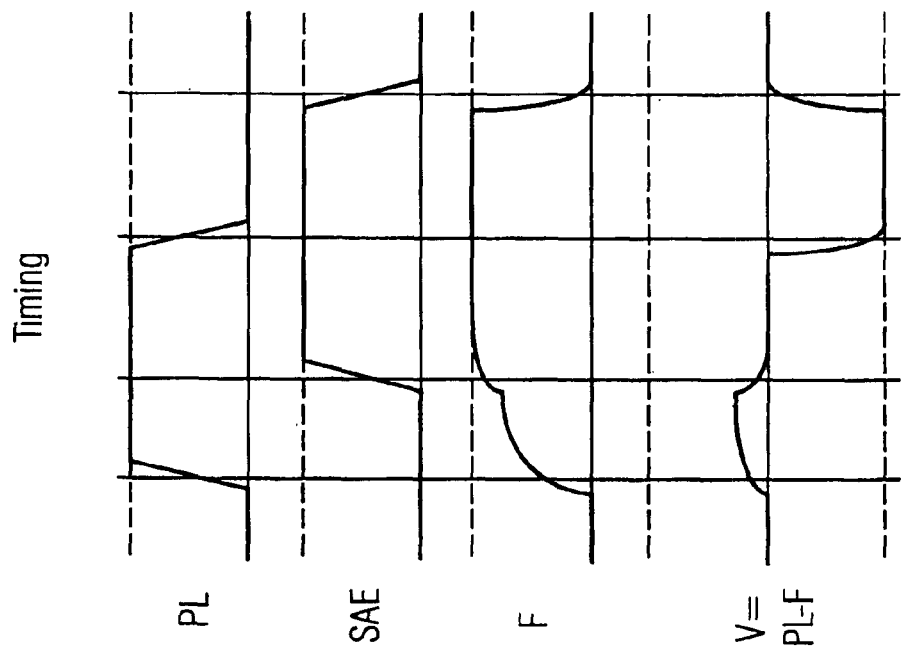
FIGS. 4 and 5 show the major control signals and the obtained voltages for reading "1" and "0" suitable for operating the circuits in FIGS. 3a and 3b.
Figure 4:
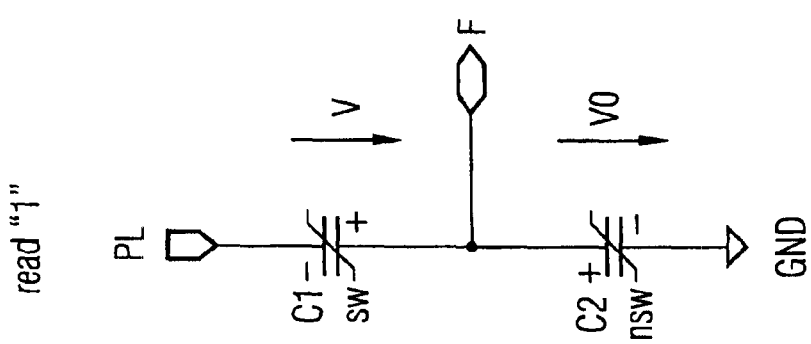
Figure 5:
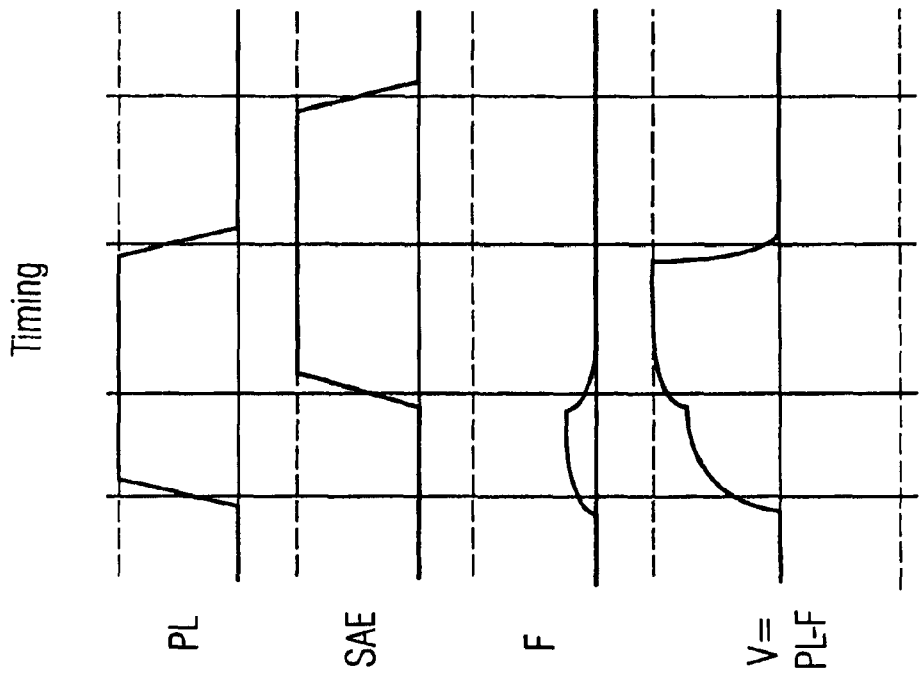
Figure 5:
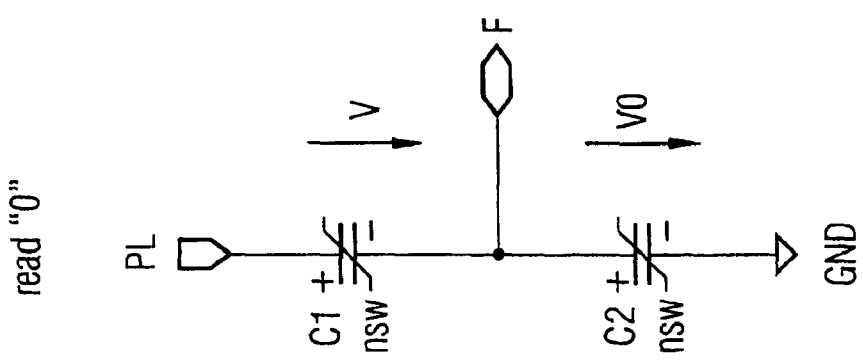

FIGS. 4 and 5 show the major control signals and the obtained voltages for reading "1" (FIG. 4) and "0" (FIG. 5) suitable for operating the circuits in FIG. 3. In the figure "SAE" indicates the activation of the sense amplifier.

Figure 6:
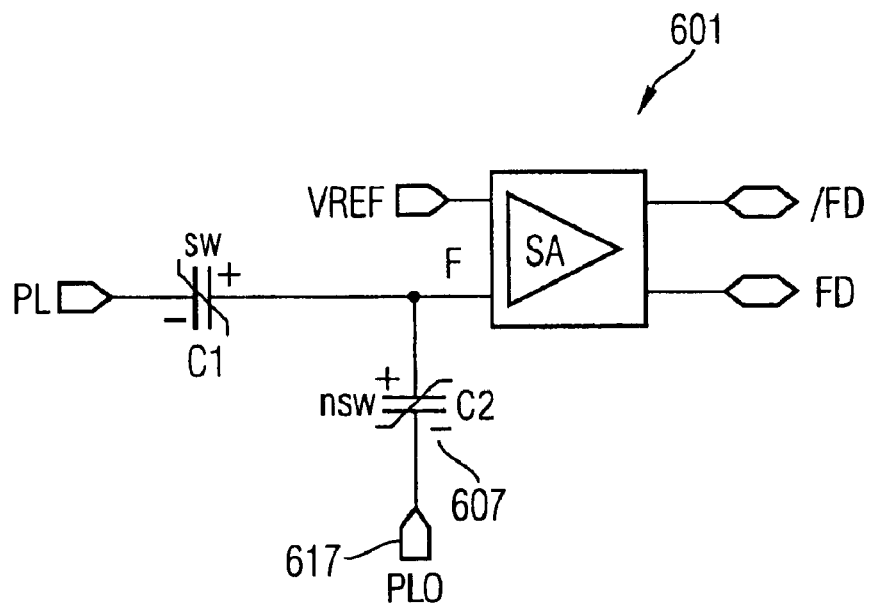
FIGS. 6 and 7 show other embodiments of the present invention wherein capacitor pairs are always maintained in the reversed polarization states.
Figure 7:
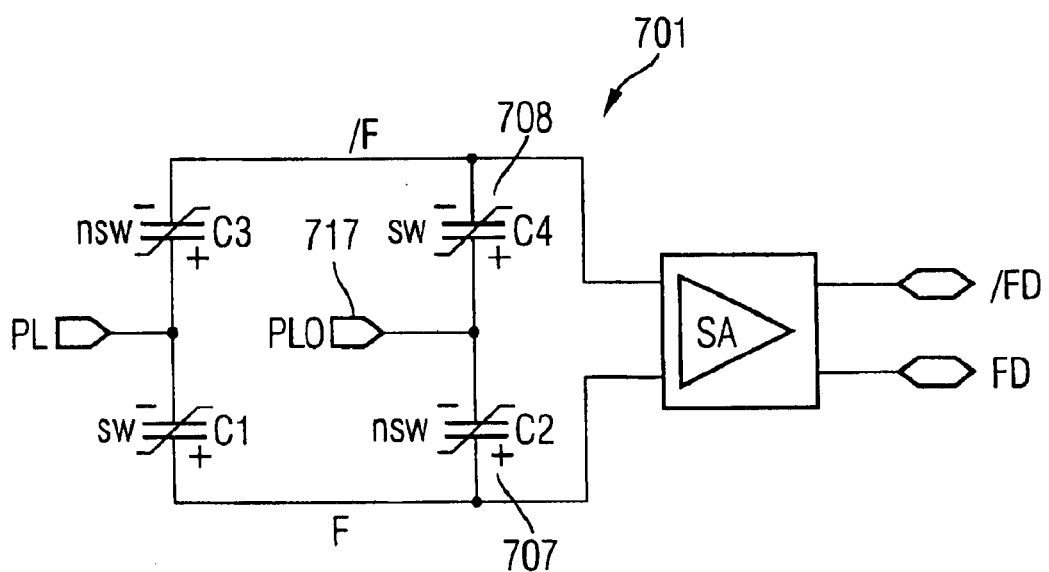

FIGS. 6 and 7 show other embodiments, circuits 601 and 701, respectively, of the invention. The measurement capacitors C2 107 of FIG. 1 and C2 207' and C4 208 of FIG. 2 are replaced by ferroelectric measurement capacitors C2 607

Figure 8:
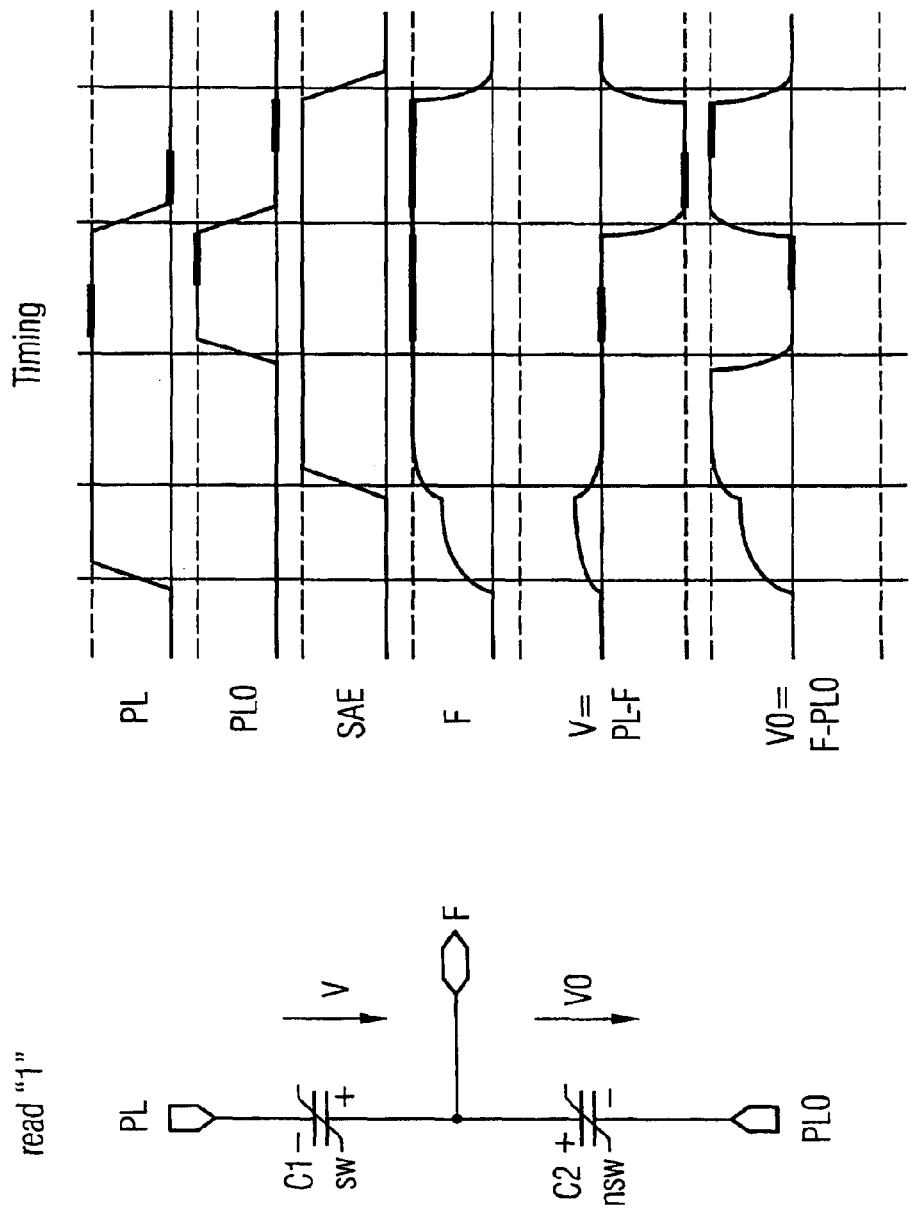
FIGS. 8 and 9 show the major control signals end the obtained voltages for reading "1" and "0" suitable for operating the circuits in FIGS. 6 and 7.
Figure 9:
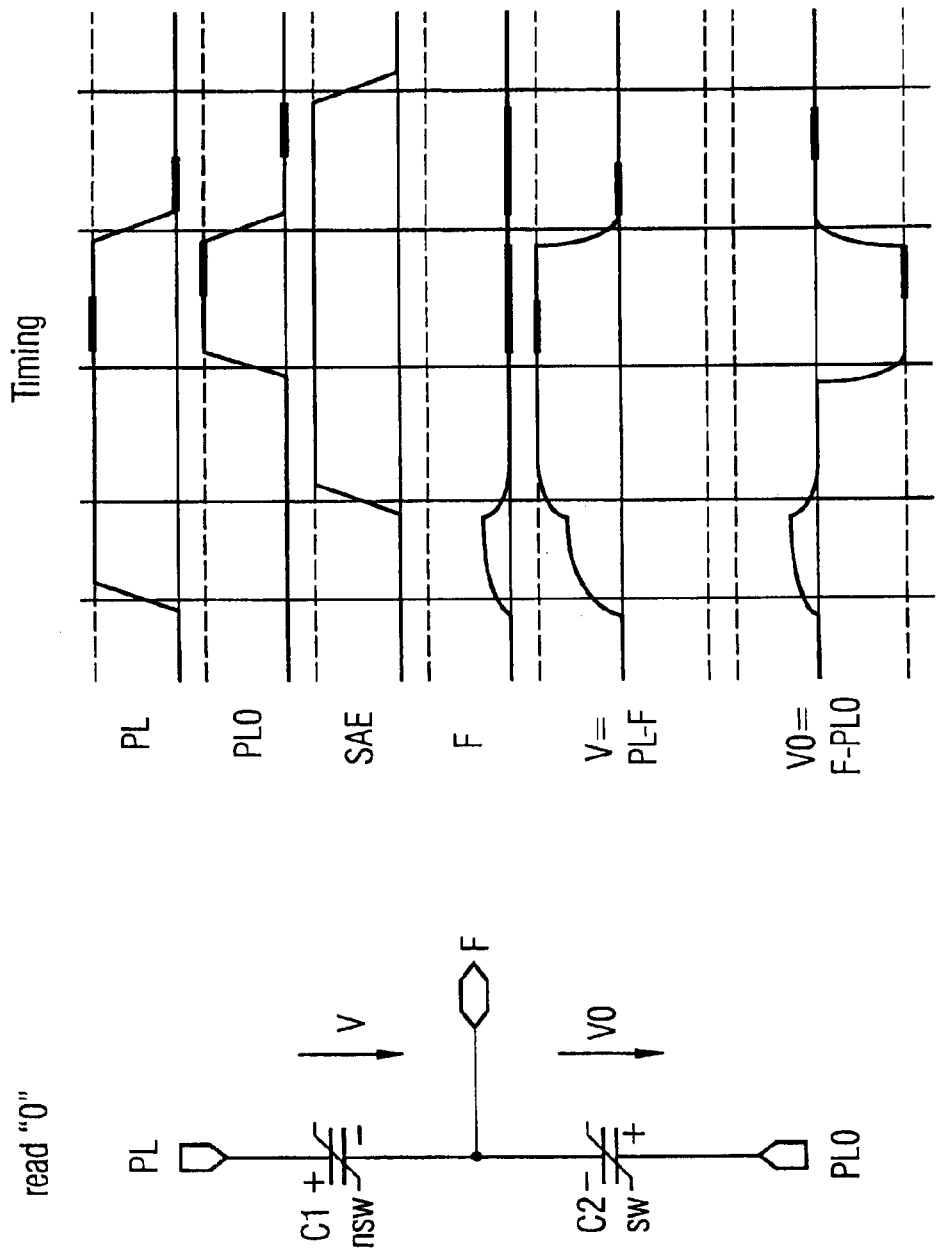

(FIG. 6) and C2 707 and C4 708 (FIG. 7) which are similar to the ferroelectric storage capacitors C1 103 of FIG. 1 and C1 203 and C3 204 of FIG. 2. In these embodiments these measurement capacitors C2 607, C2 707 and C4 708 are always in the reversed state compared to the corresponding storage capacitor, e.g. if C1 stores "1" then C2 stores "0" and vice versa. Additional plate signals (PLO) 617, 717 are needed for write back of the data to the measurement capacitors. The signal timing for operating the circuits 601, 701 are shown in FIGS. 8 and 9 for a read "1" and a read "0", respectively. These timing sequences make sure that each capacitor pair (C1/C2 and C3/C4) is always maintained in the reversed polarization state, e.g. C1="1" and C2="0" or C1="0" and C2="1".

Figure 10:
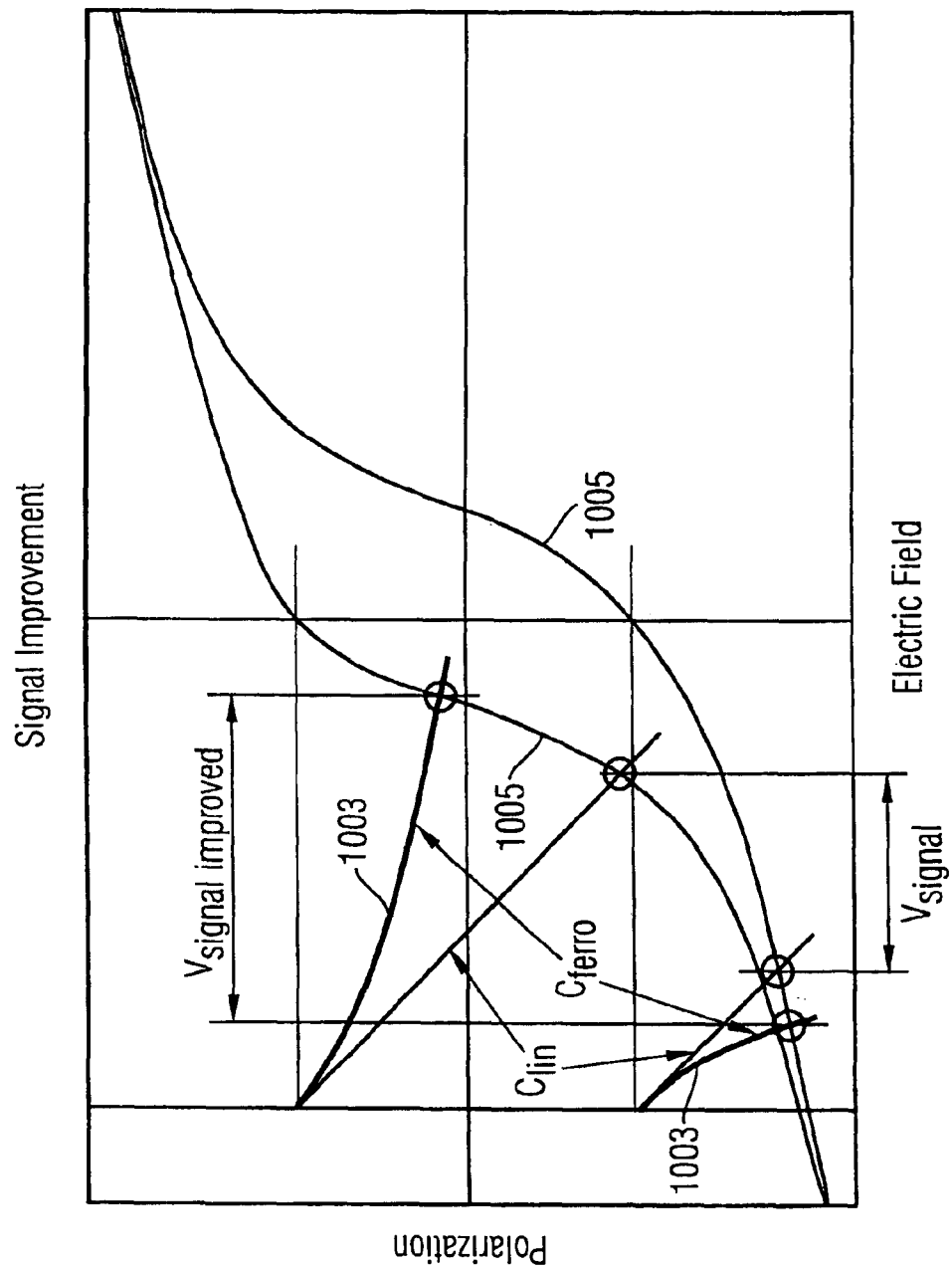
FIG. 10 shows how the read signal obtained from the circuits of the present invention are significantly enhanced.

The read signal Vsignal obtained from the circuits of the present invention are significantly enhanced as shown in FIG. 10. The intersection of the characteristics 1005 of the storage capacitor and corresponding characteristics 1003 of the measurement capacitor determines the read signals and the signal differences.

Figure 11:
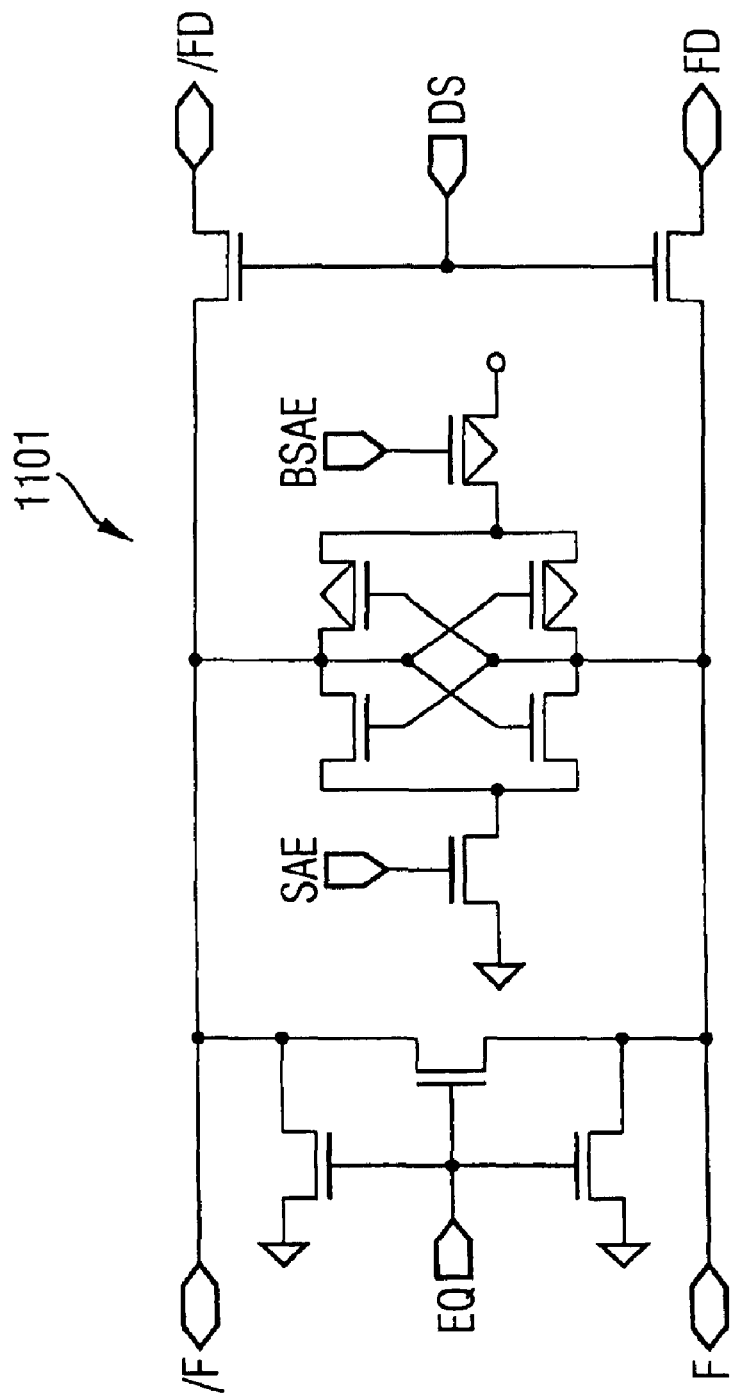
FIG. 11 shows an implementation of a differential sense amplifier for use as the sense amplifier of the circuits of FIGS. 3, 6 and 7.

FIG. 11 shows an implementation of a differential sense amplifier 1101 for use as the sense amplifier of the circuits of FIGS. 3, 6 and 7.

Figure 12:
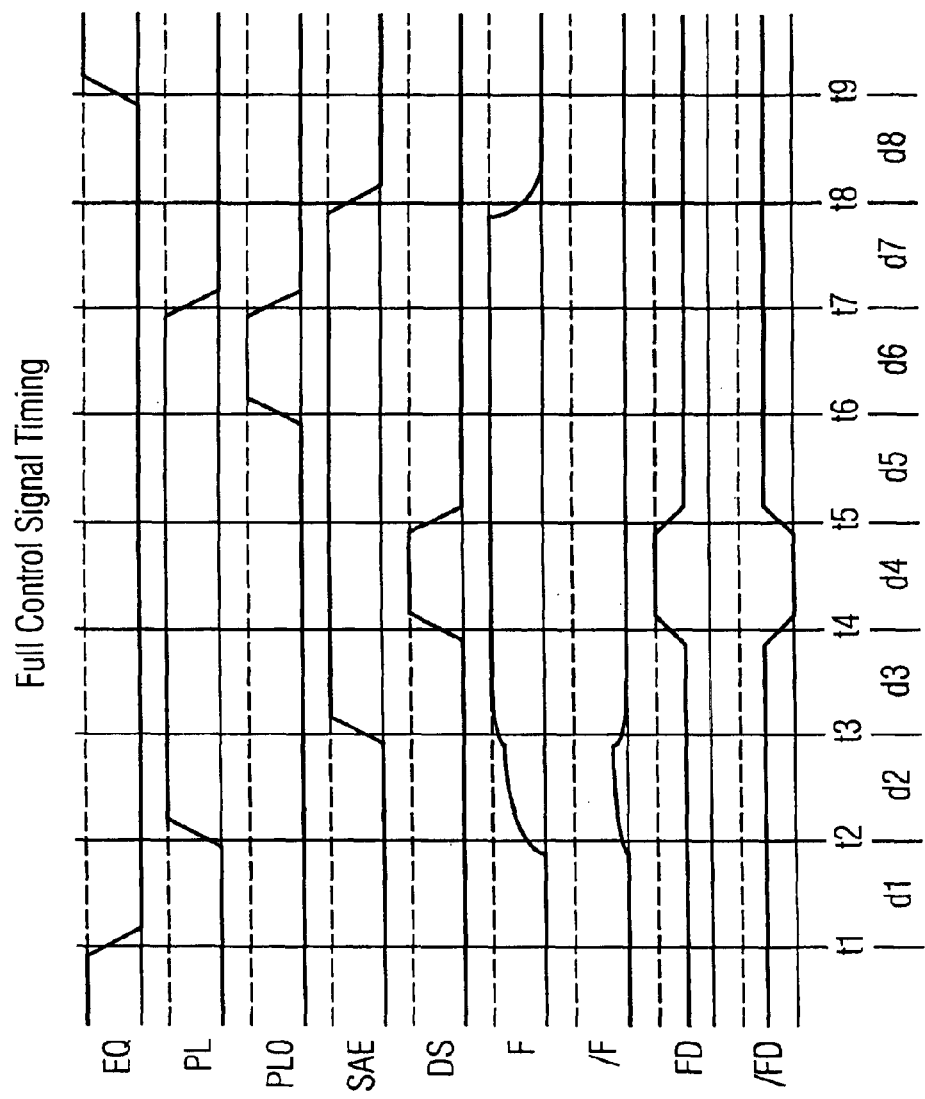
FIG. 12 shows a timing diagram with all the major required control signals for the circuit of FIG. 7.

FIG. 12 shows a timing diagram with all the major required control signals for the circuit 701 of FIG. 7. During d2 the read signal is developed on the nodes F and /F. During d3 the signal is amplified to full logic levels by the sense amplifier. During d4 the data is transferred from or to an external circuit. During d5–d7 the data write back to the storage and measurement capacitors is preformed.

In all of the above embodiments the described components can be formed on the same die. Also, the term "connected" as used in the present disclosure dose not imply that connected components must be in direct physical contact. Rather, the components need only be electrically connected.

Thus, although the invention has been described above using particular embodiments, many variations are possible within the scope of the claims, as will be clear to a skilled reader.

We claim:

1. A ferro fuse cell comprising:
   a ferroelectric storage capacitor electrically connected to a plate on one side and to a sense amplifier on the other side; and
   a ferroelectric measurement capacitor electrically connected to the ferroelectric storage capacitor, the ferroelectric measurement capacitor being maintained in a non-switching state.

2. The ferro fuse cell of claim 1, wherein one of electrode of the ferroelectric measurement capacitor is electrically connected between the ferroelectric storage capacitor and the sense amplifier.

3. The ferro fuse cell of claim 1, wherein the ferroelectric measurement capacitor electrically connects the ferroelectric storage capacitor to ground.

4. The ferro-fuse cell of claim 1, wherein the ferroelectric measurement capacitor electrically connects the ferroelectric storage capacitor to a second plate switched on to write back data to the measurement capacitor.

5. A ferro fuse cell comprising:
   a ferroelectric storage capacitor electrically connected to a plate on one side and to a sense amplifier on the other sdie;
   a ferroelectric measurement capacitor electrically connected to the ferroelectric storage capacitor;
   a second ferroelectric storage capacitor electrically connected the plate on one side and to the sense amplifier on the other side; and
   a second ferroelectric measurement capacitor electrically connected to the second ferroelectric storage capacitor and the plate.

6. The ferro-fuse cell of claim 5, wherein both of the ferroelectric measurement capacitors are electrically connected to ground.

7. The ferro-fuse cell of claim 5, wherein both of the ferroelectric measurement capacitors are electrically connected a second plate switched on to write back data to the measurement capacitors.

8. The ferro-fuse cell of claim 7, wherein the ferroelectric measurement capacitor is in a reverse state relative to the ferroelectric storage capacitor and the second ferroelectric measurement capacitor is in a reverse state relative to the second ferroelectric storage capacitor.

9. The ferro fuse cell of claim 5, wherein one electrode of the second ferroelectric measurement capacitor is electrically connected between the second ferroelectric storage capacitor and the sense amplifier.

* * * * *